United States Patent [19]

Podowski

[11] 4,010,447
[45] Mar. 1, 1977

[54] SIGNAL TRANSMITTER USING AN ACTIVE THICK FILM SUBSTRATE

[75] Inventor: Robert R. Podowski, Elmhurst, Ill.

[73] Assignee: Zenith Radio Corporation, Chicago, Ill.

[22] Filed: Jan. 7, 1976

[21] Appl. No.: 647,291

[52] U.S. Cl. ............ 340/167 R; 340/171 PF; 340/384 R; 178/DIG. 15; 343/228

[51] Int. Cl.² ............ H04Q 9/14; H04Q 9/10

[58] Field of Search ......... 340/166 R, 351, 171 PF, 340/384 R, 384 E, 167 R, 3 A; 343/225, 228; 178/DIG. 15

[56] References Cited

UNITED STATES PATENTS 3,949,322  4/1976  Morita ............... 178/DIG. 15

Primary Examiner—Harold Pitts
Attorney, Agent, or Firm—Nicholas A. Camasto

[57] ABSTRACT

A battery powered portable acoustic transmitter comprises a plurality of single-pole, momentary contact switches, a type 555 pulse producing integrated circuit chip, and an electroacoustic transducer and matching tuning coil. An RC timing circuit includes a plurality of resistors selectively connectable in the timing circuit by the switches to vary the pulse output frequency. A transistor output circuit amplifies the pulses for driving the transducer. A plurality of diodes supply power to the chip and the transistor output circuit whenever a switch is activated. The integrated circuit chip, resistors, diodes and transistor are part of an active thick film circuit.

5 Claims, 1 Drawing Figure

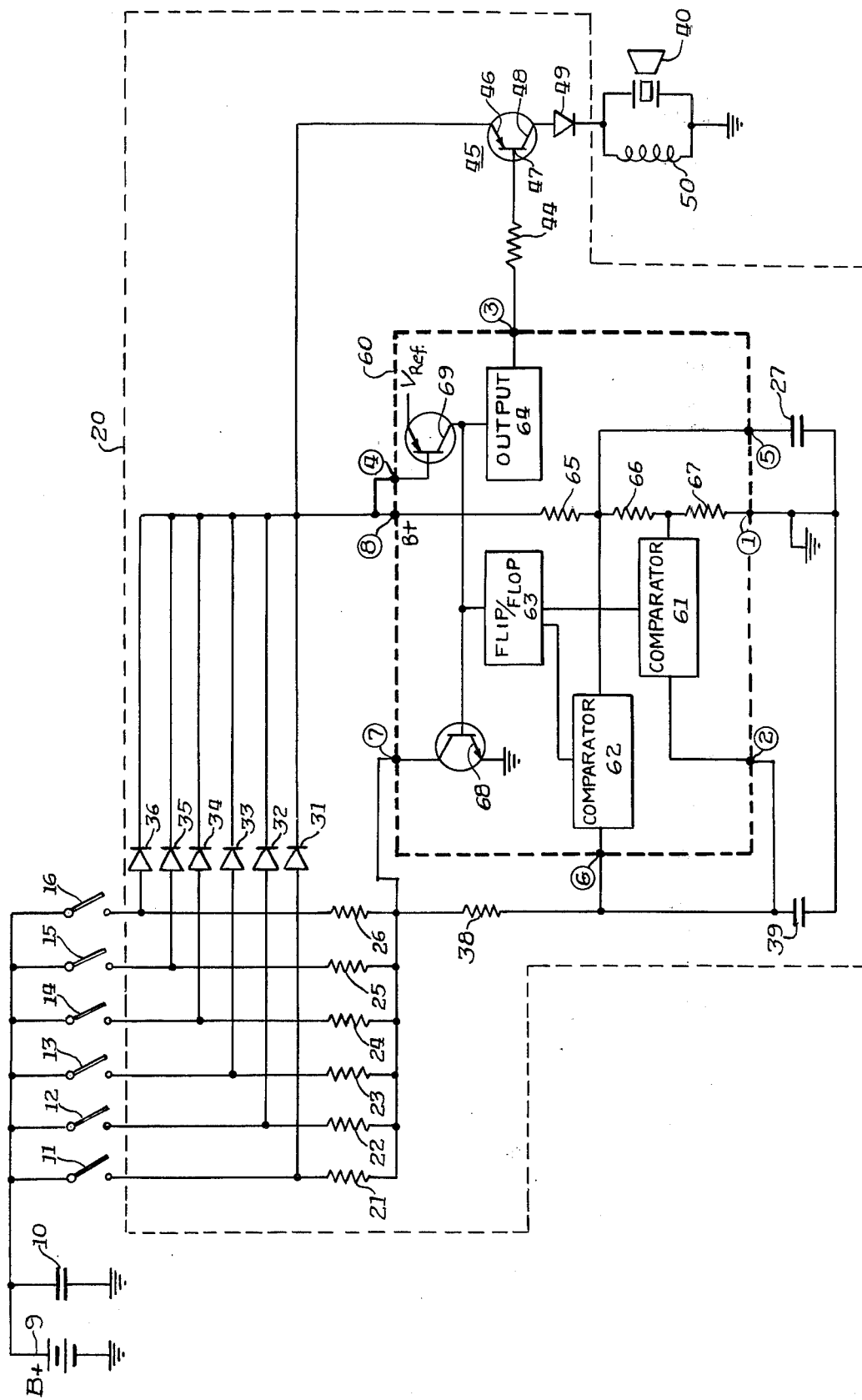

SIGNAL TRANSMITTER USING AN ACTIVE THICK FILM SUBSTRATE

RELATED PATENT APPLICATION

The remote control transmitter of this application is related to the remote control transmitter described and claimed in copending application Ser. No. 592,582, filed July 2, 1975, in the names of Robert R. Podowski and Richard W. Citta, entitled ELECTRONIC REMOTE CONTROL TRANSMITTER, and assigned to Zenith Radio Corporation.

BACKGROUND OF THE INVENTION

This invention concerns portable transmitters for wireless remote control systems, especially those for controlling operations of a plurality of television receiver functions, such as on-off, volume and channel change. Specifically the invention is directed to remote control systems employing an electronic generating apparatus for producing electrical signals which are thereafter converted to acoustical signals via the mechanism of an electroacoustic transducer.

The transmitter of the related application mentioned above incorporates a two transistor oscillator arrangement which is frequency controlled by resistive elements and singlepole, momentary contact switches. The output of the oscillator is supplied to an output transistor circuit which drives a tuned electroacoustic transducer. While the instant invention performs the same functions and indeed utilizes similar switches, output transducer and single resistors for controlling the output signal frequencies, the oscillator mechanism is different and the inventions are distinct.

The transmitter apparatus in the above-mentioned application comprises a printed circuit supporting discrete resistors, transistors, capacitors and coils for producing the appropriate control frequencies. In contrast, the apparatus of the present invention has an active thick film circuit which includes all components except the battery, bypass capacitor, switch assembly, transducer and tuning coil. In particular a well-known pulse producing integrated circuit chip is made a part of the active thick film circuit. The result is a readily manufacturable, economical, stable circuit element which may be conveniently used in a portable signal transmitter.

The advantages obtainable with thick film processing contribute to the attractiveness of the invention. For example, the individual frequency determining resistors (used to change the time constant for the pulse producing circuit) may be laser trimmed with speed and precision. In practice the resistors are trimmed on the substrate (before encapsulation) while the output electrical frequency is being measured. Thus, rather than specifying close tolerances on parts, or trimming the resistor to specific values, they are trimmed until the desired frequencies are obtained. The process is readily automated and contributes greatly to the advantages realized by the inventive combination.

OBJECTS OF THE INVENTION

An object of this invention is to provide a novel transmitter for a remote control system.

A further object of this invention is to provide an improved electronic remote control transmitter.

SUMMARY OF THE INVENTION

In accordance with the invention, a portable transmitter for selectively generating different frequency control signals comprises a battery, a plurality of resistors, a corresponding plurality of switches connected between the battery and the resistors, a pulse producing circuit, a timing capacitor coupled to the pulse producing circuit for varying the pulse frequency thereof in cooperation with the resistors and switches, a transistor output circuit driving a transducer for developing corresponding frequency acoustic signals, and a plurality of diodes for electrically connecting the battery to the pulse producing circuit and to the output circuit responsive to closure of any of the switches.

BRIEF DESCRIPTION OF THE DRAWING

The single drawing comprises a schematic diagram of the transmitter of the invention.

DESCRIPTION OF THE PREFERRED EMBODIMENT

Referring to the drawing, a battery 9 has its negative terminal connected to a ground reference and its positive terminal connected to a bypass capacitor 10. A plurality of single-pole, momentary contact switches 11–16 have one terminal connected in common to the positive terminal of battery 9, which is labelled B+.

An active thick film circuit 20 is indicated by the light dashed-line box which encloses all of the components mounted thereon. A type 555 pulse producing integrated circuit chip 60 is shown by the smaller heavy dashed-line box with encircled terminal numbers around its periphery. The substrate of thick film circuit 20 is conventional and may be fabricated of alumina. Since the invention is not concerned with thick film processing itself, no details or description thereof will be given.

A plurality of resistors 21–26 are deposited on the thick film substrate and are arranged with each having one terminal connectable to the positive terminal of battery 9 through switches 11–16, respectively, and the other terminal connected in common to the series connection of a resistor 38 and a timing capacitor 39. It will be readily apparent that upon closure of any of switches 11–16, the selected one of resistors 21–26 forms an RC timing circuit with resistor 38 and capacitor 39. A plurality of diodes 31–36 have their anode terminals connected across the "switch sides" of resistors 21–26, respectively, and their cathode terminals connected in common to pulse producing circuit 60 and to an output circuit including a PNP transistor 45 and a diode 49. Transistor 45 has an emitter 46, a base 47 and a collector 48. The output of pulse circuit 60 is coupled through a resistor 44 to base 47 of transistor 45. Emitter 46 is connected to the junction of the cathodes of diodes 31–36 and collector 48 is coupled to the anode of diode 49. Transistor 45 drives an electroacoustic transducer 40 comprising a ceramic microphone having a tuning coil 50 coupled thereacross.

Pulse producing circuit 60, as mentioned above, is a conventional integrated circuit commonly known as a 555 type timer linear integrated circuit. It is available, for example, from Signetics of Sunnydale, Calif., under this type designation.

A functional drawing of the chip circuitry shows a comparator 61, a comparator 62, both of which drive a flip-flop 63 which, in turn, supplies an output 64. The circled terminal numbers correspond to the actual terminals on an "off the shelf" 555 chip. The comparators are connected across a resistor string comprising three equal-value resistors 65, 66 and 67 connected between B+ pin 8 and ground pin 1. The voltage drop across each of resistors 65, 66 and 67 is ⅓ B+. A discharge transistor 68 is connected between pin 7 and ground and a reset transistor 69 is driven from pin 4.

The inputs of the comparators 61 and 62 are pins 2 and 6, respectively. Timing capacitor 39 is connected to the input of both comparators since pins 2 and 6 are connected in common. The other input of comparator 61 is connected to the junction of resistors 66 and 67 and is, therefore, at ⅓ B+ potential. Similarly, the other input of comparator 62 is connected to the junction of resistors 65 and 66 and is at ⅔ B+. Both comparator outputs are connected to flip-flop 63 and control its state, which, in turn, controls operation of discharge transistor 68 and supplies pulses to output 64.

Discharge transistor 68 is cut off during one state of flip-flop 63 and conductive during its other state. When transistor 68 is conductive, timing capacitor 39 is discharged therethrough, and when it is cut off, timing capacitor 39 is allowed to charge from B+ through resistor 38 and the selected one of resistors 21–26. Since comparators 61 and 62 control the states of flip-flop 63, they control charge and discharge of capacitor 39. When the voltage on capacitor 39 rises above ⅔ B+ comparator 62 causes flip-flop 63 to drive transistor 68 conductive which results in timing capacitor 39 commencing discharge. When the voltage on discharging capacitor 39 drops below ⅓ B+, comparator 61 again triggers flip-flop 63 which drives discharge transistor 68 into cutoff enabling capacitor 39 to charge again. Thus capacitor 39 is charged and discharged between ⅓ and ⅔ B+ volts. The charge and discharge time is a function of the connected resistance in the RC circuit (capacitor 39 is fixed). The connected resistance is a function of which of switches 11–16 is closed and consequently the pulse output frequency from output circuit 64 is similarly related to the actuated switch. Note that reset transistor 69 is maintained in cutoff via the fixed connection of its base electrode to pin 8 which is at B+ potential whenever the transmitter is operated. Capacitor 27 connected from pin 5 to ground is a bypass.

It will be appreciated that no power is drawn by the transmitter circuitry until one of the switches 11–16 is actuated. To avoid the complexity and expense of doublepole switches, diodes 31–36 are incorporated to supply B+ voltage to pulse producing circuit 60 and output transistor 45 simultaneous with actuation of switches 11–16 corresponding to selection of any desired control frequency. The diodes also prevent any of non-selected resistors 21–26 from affecting the connected resistance in the charge path of timing capacitor 39 when the transmitter is operated. Thus, each of resistors 21–26 is individual and does not affect the time constant established by selection of any of the other resistors.

The output from pin 3 of pulse producing circuit 60 is supplied, through resistor 44, to the base of output transistor 45 where it is amplified and drives the tuned load comprising microphone 40 and tuning coil 50. Diode 49 serves to decouple the pulse producing circuit (oscillator) from transducer 40.

In practice, active thick film circuit 20 is fabricated with the resistors, capacitors (except bypass capacitor 10), diodes and transistor being deposited on an insulating substrate using thick film techniques. After baking the 555 chip is attached and, prior to encapsulation of the finished circuit, each of resistors 21–26 is laser trimmed to produce the proper output frequency from transistor 45. This technique is a very important aspect of the invention, since precise control of the value of capacitor 39 (which it will be recalled is also deposited) is rendered unnecessary. Similarly the value of resistor 38 is not critical. Of even more importance, this technique enables "tailoring" of the circuitry to produce precise control frequencies despite variations in parameters of the 555 chip which would otherwise require very close tolerances on the values of other parts.

As is fully described in the copending application referred to above, the frequency of the electronic transmitter must be maintained within very narrow limits to achieve the excellent noise immunity found in the "digital" type receiver system. Thus, with the invention it is unnecessary to hold these values of resistors 21–26, resistor 38 and capacitor 39 to critical tolerances to insure correct output frequencies from the active thick film network.

Thereafter the thick film circuit is encapsulated and preferably mounted on a printed circuit board or other support along with a transducer, tuning coil, switch assembly and bypass capacitor. It will be further appreciated that the 555 chip fabrication mask may be expanded to include diodes 31–36, resistors 38 and 44, transistor 45 and diode 49 and this larger integrated circuit can be attached directly on the thick film substrate. It is anticipated that the "yield" of active thick film substrate transmitter circuits fabricated in accordance with the invention will be sufficiently high to prove an economically attractive arrangement.

What has been described is a novel circuit arrangement for a remote control transmitter which incorporates an active thick film network utilizing a standard pulse producing integrated circuit chip in its oscillator arrangement. It is recognized that numerous modifications and departures from the preferred embodiment of the invention may be made by those skilled in the art without departing from the true spirit and scope of the invention as set forth in the appended claims.

What is claimed is:

1. A portable transmitter for selectively generating different frequency signals to control corresponding functions in a television receiver comprising:
    a battery;
    a plurality of resistors;
    a corresponding plurality of switches connected between said battery and said resistors;
    a pulse producing circuit;
    a timing capacitor coupled to said pulse producing circuit for varying the frequency thereof in cooperation with said resistors and switches;
    an output circuit including a transducer for developing acoustic signals corresponding in frequency to the pulses developed by said pulse producing circuit; and
    a plurality of diodes arranged to electrically connect said battery to said pulse producing circuit and to said output circuit responsive to closure of any of said switches.

2. A portable transmitter as set forth in claim 1, wherein said diodes are individually connected to different ones of said resistors and commonly connected to said pulse producing circuit and said output circuit.

3. A portable transmitter as set forth in claim 2, further including another resistor connected between said plurality of resistors and said timing capacitor.

4. A portable transmitter as set forth in claim 3, wherein all of said resistors and said capacitors are deposited in a thick film circuit on an insulated substrate.

5. A portable transmitter as set forth in claim 4, wherein said pulse producing circuit comprises an integrated deposited mounted on said substrate.

* * * * *